United States Patent
Legros

(10) Patent No.: US 11,073,937 B2
(45) Date of Patent: Jul. 27, 2021

(54) CAPACITIVE INTERFACE DEVICE WITH MIXED ELECTRODE STRUCTURE, AND APPARATUS COMPRISING THE DEVICE

(71) Applicant: FOGALE NANOTECH, Nîmes (FR)

(72) Inventor: Eric Legros, Ales (FR)

(73) Assignee: FOGALE NANOTECH, Nîmes (FR)

( * ) Notice: Subject to any disclaimer, the term of this patent is extended or adjusted under 35 U.S.C. 154(b) by 63 days.

(21) Appl. No.: 16/099,656

(22) PCT Filed: Apr. 25, 2017

(86) PCT No.: PCT/EP2017/059823
§ 371 (c)(1),
(2) Date: Nov. 7, 2018

(87) PCT Pub. No.: WO2017/194303
PCT Pub. Date: Nov. 16, 2017

(65) Prior Publication Data
US 2019/0146606 A1    May 16, 2019

(30) Foreign Application Priority Data

May 12, 2016 (FR) ...................................... 1654233

(51) Int. Cl.
*G06F 3/044* (2006.01)
*G06F 3/041* (2006.01)
*H03K 17/96* (2006.01)

(52) U.S. Cl.
CPC ........ *G06F 3/04164* (2019.05); *G06F 3/0445* (2019.05); *G06F 3/0446* (2019.05); *G06F 3/041662* (2019.05); *H03K 17/9622* (2013.01); *G06F 2203/04107* (2013.01); *G06F 2203/04108* (2013.01)

(58) Field of Classification Search
CPC .... G06F 3/041; G06F 3/0416; G06F 3/04164; G06F 3/041662; G06F 3/044; G06F 3/0445; G06F 3/0446; H03K 17/962; H03K 17/9622
See application file for complete search history.

(56) References Cited

U.S. PATENT DOCUMENTS 5,815,031 A * 9/1998 Tan ..................... H01L 23/5222
326/21
8,933,710 B2   1/2015 Blondin et al.
(Continued)

OTHER PUBLICATIONS

French Search Report from French Patent Application No. 1654233, dated Jan. 20, 2017.
(Continued)

*Primary Examiner* — Huy Q Phan
*Assistant Examiner* — David B Frederiksen
(74) *Attorney, Agent, or Firm* — Greer, Burns & Crain, Ltd.

(57) ABSTRACT

A capacitive interface device, includes a detection surface with one or more first capacitive electrodes extending in a first direction (X), second capacitive electrodes extending in a second direction (Y), third capacitive electrodes arranged in a matrix between the second capacitive electrodes and facing the one or more first capacitive electrodes, and linking tracks electrically connected within the detection surface to a plurality of adjacent third capacitive electrodes.

15 Claims, 4 Drawing Sheets

(56) References Cited

U.S. PATENT DOCUMENTS

| | | |
|---|---|---|
| 9,268,431 B2* | 2/2016 | King ..................... G06F 3/0416 |
| 9,323,398 B2* | 4/2016 | Bernstein .............. G06F 3/0416 |
| 2014/0132559 A1* | 5/2014 | Kim ........................ G06F 3/044 |
| | | 345/174 |
| 2014/0253499 A1 | 9/2014 | Lee et al. |
| 2014/0360854 A1 | 12/2014 | Roziere |
| 2015/0035792 A1* | 2/2015 | Roziere ................. G06F 3/0443 |
| | | 345/174 |
| 2015/0075959 A1 | 3/2015 | Lu et al. |
| 2015/0084911 A1* | 3/2015 | Stronks ................. G06F 3/0446 |
| | | 345/174 |
| 2015/0160754 A1 | 6/2015 | Wenzel |
| 2016/0188038 A1* | 6/2016 | Roziere .............. G06F 3/04182 |
| | | 345/174 |
| 2016/0274699 A1* | 9/2016 | Shishido ................. G06F 3/044 |
| 2016/0291736 A1* | 10/2016 | Tamaki ................. H01L 27/323 |
| 2018/0032187 A1* | 2/2018 | Bernard .............. G06F 3/04164 |

OTHER PUBLICATIONS

International Search Report from International Patent Application No. PCT/EP2017/059823, dated Jul. 19, 2017.

* cited by examiner

CAPACITIVE INTERFACE DEVICE WITH MIXED ELECTRODE STRUCTURE, AND APPARATUS COMPRISING THE DEVICE

BACKGROUND

The present invention relates to a capacitive interface device with a mixed, matrix and rows-and-columns electrode structure. It also relates to an apparatus comprising such a device.

The field of the invention is more particularly, but non-limitatively, that of capacitive measurement systems for detection and control applications.

Various techniques are known for producing capacitive detection and control devices, for example for anti-collision or industrial device control applications. Such devices generally comprise capacitive sensing electrodes which make it possible to detect objects of interest by capacitive coupling between these objects and the capacitive electrodes. The capacitive electrodes can be arranged so as to cover opaque detection surfaces such as the casings of apparatus or elements of robots. They can also be superimposed on display screens (for example of the TFT or OLED type) in order to produce human-machine interfaces.

The capacitive electrodes can be arranged in the form of crossed rows and columns.

This configuration has the advantage of requiring few electrodes, i.e. a total of L+C electrodes for L rows and C columns.

It is possible to detect the presence and the position of an object of interest such as a finger by measuring a disturbance of the coupling capacitances between the electrodes in rows and the electrodes in columns, when the finger approaches a point of intersection. This measurement mode is called mutual mode.

However, this measurement mode has the drawback of lacking sensitivity, and does not make it possible to detect objects at a distance from the measurement surface.

It is also possible to use a direct measurement of the coupling capacitances between the objects of interest and each electrode in a row or in a column. This measurement mode is called the "self-capacitance" mode. It allows improved measurement sensitivity in order to detect objects at a distance but has the major drawback of allowing the appearance of ghost measurements when several objects are present facing different rows and columns.

The electrodes can also be arranged in a matrix.

In this case, by utilizing suitable techniques for direct measurement of the coupling capacitances between the objects of interest and each electrode ("self-capacitance" mode), it is possible to obtain very high sensitivities and thus unambiguously detect several objects of interest without ambiguity including at a significant distance from the electrodes.

Among the techniques in "self-capacitance" mode which make it possible to obtain a high sensitivity measurement, are known for example:

techniques called "active guard" in which all of the electrodes and adjacent guard surfaces are polarized at one and the same potential (the guard potential) in order to avoid the appearance of parasitic coupling capacitances. Measurement of the capacitance is generally carried out with a charge amplifier.

techniques called "floating electronics", or "perfect guard" techniques, in which all of the electrodes, and nearby guard surfaces, as well as the detection electronics, are polarized or referenced to one and the same potential (the guard potential), which makes it possible to eliminate totally the appearance of parasitic coupling capacitances. Such a technique is for example described in the document U.S. Pat. No. 8,933,710.

However, arranging the electrodes in the form of a matrix has the drawback of requiring a large number of measurement electrodes, i.e. the total of L×C electrodes for a matrix of L rows and C columns.

In order to produce touch and contactless interfaces with large dimensions (for example in order to produce large sensitive surfaces) it is necessary to be able to:

detect several objects without ambiguity at a significant distance (several tens of centimeters); and distinguish or discriminate between close objects (for example 2 fingers) in contact with the measurement surface.

This can be achieved with electrodes arranged in the form of a matrix, but a large number of electrodes is necessary, and this poses problems:

there is a need for a large number of measurement paths and/or a high multiplex rate is needed;

the number and surface area of the linking tracks which connect the measurement electrodes at the edge of the detection surface become significant, which poses in particular problems of cross-talk if the objects of interest interact with the tracks. In fact, a capacitive coupling between an object of interest and a linking track is interpreted as a capacitive coupling between this object of interest and the electrode to which this linking track is connected, which generates an erroneous item of location information.

A subject of the present invention is to propose a capacitive interface device which makes it possible to produce detection surfaces with large dimensions.

A subject of the present invention is also to propose a capacitive interface device which makes it possible both to unambiguously detect several objects without ambiguity at a significant distance, and to distinguish or discriminate between close objects.

A subject of the present invention is also to propose such a device making it possible to optimize the number of electrodes utilized.

SUMMARY

This objective is reached with a capacitive interface device comprising a detection surface with:

one or more first capacitive electrodes extending at least in a first direction, and second capacitive electrodes arranged facing the first capacitive electrode or electrodes and extending in a second direction different to the first direction;

characterized in that it also comprises:

third capacitive electrodes arranged in a matrix between the second capacitive electrodes and facing the first capacitive electrode or electrodes, and linking tracks arranged in the detection surface so as to electrically connect a plurality of adjacent third capacitive electrodes.

According to the embodiments, the interface device according to the invention can comprise:

A first capacitive electrode extending along the entire detection surface;

A plurality of first capacitive electrodes extending in a first direction,

First capacitive electrodes and second capacitive electrodes extending respectively in first and second directions that are substantially perpendicular;

First capacitive electrodes extending in rows or in the form of rows, and second capacitive electrodes extending in columns or in the form of columns (or vice-versa);

First capacitive electrodes and/or second capacitive electrodes with a width or a cross-section that is constant in the direction of elongation thereof;

First capacitive electrodes and/or second capacitive electrodes with a width or a cross-section having variations or differences in the direction of elongation, for example in order to include patterns or specific surfaces in certain places;

First and second electrodes that are crossed and superimposed;

First and/or second electrodes that extend from an edge of the detection surface to an opposite edge of this detection surface;

First and/or second electrodes that extend from an edge of the detection surface over a portion of this detection surface (for example a half);

First electrodes produced respectively in the form of portions of interconnected surfaces within or outside the detection surface;

Third electrodes that are inserted between the second electrodes, on one and the same layer of electrically conductive material or on a different layer;

Third electrodes that are arranged so as to leave free or essentially free crossing or superimposition areas between the first and second electrodes, in which the first and second electrodes are facing each other;

Third electrodes that are arranged in a matrix of rows and columns;

Third electrodes that are interconnected in groups at the detection surface by portions of linking tracks.

The device according to the invention can comprise linking tracks with a portion connecting at least a third capacitive electrode at an edge of the detection surface extending essentially in the second direction.

The linking tracks can comprise tracks that extend between third electrodes (or a third electrode connected to other third electrodes) and an edge or the periphery of the detection surface, and/or between adjacent third capacitive electrodes.

These linking tracks can be partly merged with the surface of third capacitive electrodes, or in other words cross third capacitive electrodes that they connect together.

The detection surface can be defined as a surface above which objects of interest can interact with the capacitive electrodes and thus be detected. The periphery (or peripheral area) of the detection surface can be defined as an area bordering the detection surface in which the tracks and other components are protected from capacitive couplings with objects of interest or at least are not likely to be subjected to such couplings.

The device according to the invention can in particular comprise:
linking tracks arranged, at least partly, or essentially, substantially parallel to the second capacitive electrodes;
linking tracks arranged near to second capacitive eletrodes;
linking tracks extending within the detection surface between at least two third electrodes;
linking tracks extending within the detection surface in the first direction or the second direction between at least two third electrodes.

The device according to the invention can comprise first capacitive electrodes with a dimension in the second direction that is greater than the separation space between said first capacitive electrodes.

The separation space can be defined as the space that separates the adjacent edges of two successive first capacitive electrodes.

The device according to the invention can thus comprise first electrodes that are arranged so as to minimize the space separating them. Thus, the assembly of the first electrodes can constitute an effective shield against electromagnetic disturbances.

According to embodiments, the device according to the invention can comprise third capacitive electrodes with a dimension in the second direction less than or equal to the dimension of the first capacitive electrode or electrodes in said second direction and arranged respectively facing a first capacitive electrode.

Thus, it can comprise third electrodes that are aligned, in the second direction, with the first electrodes, and that are superimposed on the first electrodes.

According to other embodiments, the device according to the invention can comprise third capacitive electrodes with a dimension in the second direction less than or equal to the dimension of several successive first capacitive electrodes in said second direction. In these cases, these third capacitive electrodes are arranged respectively facing a group of several successive first capacitive electrodes.

According to embodiments, the device according to the invention can comprise:
a first electrically conductive layer with the first capacitive electrode or electrodes,
a second electrically conductive layer with the second capacitive electrodes, the third capacitive electrodes and the linking tracks.

The first electrically conductive layer is arranged opposite the detection area of objects of interest with respect to the second electrically conductive layer.

According to embodiments, the device according to the invention can comprise:
a first electrically conductive layer with the first capacitive electrode or electrodes,
a second electrically conductive layer with second capacitive electrodes,
a third electrically conductive layer, arranged between the first and second electrically conductive layers, with the third capacitive electrodes and the linking tracks.

The third layer and the first layer are arranged opposite the detection area of objects of interest with respect to the second layer.

The device can comprise linking tracks at least partly arranged under the second capacitive electrodes.

Thus, the linking tracks can be at least partly shielded by the second capacitive electrodes. This makes possible in particular to avoid parasitic capacitive couplings between these linking tracks and objects of interest, which can be a source of cross-talk.

In order to produce opaque layers, the electrically conductive layers constituting the electrodes and the linking tracks can be produced with multilayer printed circuit elements, optionally flexible.

In order to produce transparent surfaces, the electrically conductive layers constituting the electrodes and the linking tracks can be produced with deposits of transparent conductive oxides, such as for example ITO (indium tin oxide) on a dielectric substrate.

The layers constituting the electrodes and the linking tracks can also comprise metal structures based on nanowires, of the "metal mesh" type for example, that are less resistive and better suited to producing large surfaces than ITO.

The dielectric substrate can comprise for example PET (polyethylene terephthalate) of a thickness of the order of 25 μm to 100 μm, or glass.

According to embodiments, linking tracks connected respectively to adjacent third capacitive electrodes can also be electrically connected (or interconnected) at the periphery or outside the detection surface.

Thus, the device according to the invention can also comprise electrical interconnection means allowing a plurality of linking tracks connected respectively to adjacent third capacitive electrodes to be electrically connected at the periphery, in a peripheral area or outside the detection surface.

This interconnection of linking tracks can relate to all or only a portion of the linking tracks.

The device according to the invention can also comprise electronic capacitive detection means with at least one charge amplifier making it possible to carry out direct capacitance measurements between objects of interest in the vicinity of or in contact with the detection surface and groups of third capacitive electrodes.

The electronic capacitive detection means can comprise polling means making it possible to sequentially connect groups of third capacitive electrodes to a charge amplifier.

The electronic capacitive detection means can be arranged so as to polarize the first capacitive electrode or electrodes and the second capacitive electrodes at potentials substantially identical or proportional to a guard potential, at least during phases of direct measurements of capacitance with the third capacitive electrodes.

To this end, the electronic capacitive detection means can comprise switches or polling means making it possible to switch the first capacitive electrodes and the second capacitive electrodes at the potentials given.

Thus, the first capacitive electrodes and the second capacitive electrodes become guard elements, i.e. elements intended to protect the third capacitive electrodes from electromagnetic disturbances and from parasitic coupling capacitances, that are sources of measurement errors.

The guard potential can comprise one of the following potentials:
 an alternating potential;
 a direct current potential;
 a potential identical, substantially identical or proportional to a ground potential.

The ground potential can be defined for example as a general reference potential or common ground potential of the electronics or of the device. This ground potential can also be an earth. All of the potentials given above can be defined relative to this ground potential.

According to embodiments, the guard potential can be substantially identical or proportional to the electrical potential of the third capacitive electrodes when they are used for measurements, or different. In particular:
 the third capacitive electrodes can be polarized at an alternating excitation potential during the measurements, and the guard potential can be substantially identical or proportional to this alternating excitation potential; or
 the third capacitive electrodes can be polarized at an alternating excitation potential during the measurements, and the guard potential can be direct current, identical, substantially identical or proportional to the ground potential.

According to embodiments, the device according to the invention can also comprise electronic capacitive detection means with at least one charge amplifier making it possible to carry out direct capacitance measurements between objects of interest in the vicinity of or in contact with the detection surface and, respectively, one or more first capacitive electrodes and second capacitive electrodes.

According to embodiments, the device according to the invention can also comprise electronic capacitive detection means making it possible to carry out measurements of variations of coupling capacitance between one or more first capacitive electrodes and second capacitive electrodes, so as to detect the presence of objects of interest in the vicinity of or in contact with the detection surface.

The device according to the invention can comprise electronic capacitive detection means arranged so as to polarize at least one first, respectively one second capacitive electrode with an excitation potential, and to carry out a measurement of coupling capacitance on at least one second, respectively one first capacitive electrode.

According to embodiments, the excitation potential can comprise one of the following potentials:
 an alternating potential;
 a potential substantially identical or proportional to the guard potential.

According to embodiments, the electronic detection means can be arranged so as to maintain the third capacitive electrodes, at least during phases of measurement of coupling capacitances, in one of the following states:
 polarized at a direct current potential;
 polarized at a potential substantially identical to a ground potential;
 polarized at a potential substantially identical to the potential of at least one first capacitive electrode;
 polarized at a potential substantially identical to the potential of at least one second capacitive electrode;
 electrically floating.

This polarization of the third electrodes can be carried out for example by means of switches. Similarly, the third electrodes can be electrically isolated or disconnected by means of switches in order to become floating.

According to another aspect, an apparatus is proposed comprising a capacitive interface device according to the invention.

The apparatus can comprise for example a medical imaging device such as a scanner or a robot arm. It can comprise a capacitive interface device equipping walls of mobile elements and intended to detect objects or human body parts in the vicinity thereof, for anti-collision or accurate positioning applications.

The capacitive interface device can also be utilized for touch or contactless control applications in order to interact with the apparatus.

The device according to the invention can in particular comprise a capacitive interface device superimposed on or integrated in a display device.

The display device can in particular comprise a screen of the TFT or OLED type, such as for example a monitor with large dimensions for medical or industrial applications.

The capacitive interface device according to the invention is thus particularly suitable for producing large detection and/or touch control interfaces, in particular for occupational applications.

It can for example be produced in the form of a sensitive skin or a sensitive surface, for the production of a human-machine interface or for environment detection or control applications, for example for applications in robotics.

The interface device according to the invention can comprise superimposing:
- a structure of crossed electrodes, for example in rows and columns, constituted by the first electrode or electrodes and the second electrodes; and
- a matrix electrode structure with the third electrodes.

The structure of crossed electrodes of the first and second electrodes constitutes a mesh, the pitch of which is determined in the first and second directions by the distance separating the centre or the median line of two successive electrodes.

This pitch determines the spatial resolution or the minimum separation necessary between two objects of interest in order for them to be distinguished or discriminated by the first and second electrodes.

This structure of crossed electrodes is more particularly used in order to detect objects of interest in contact with, or in the immediate vicinity of the detection surface. Its sensitivity to remote objects of interest may be limited.

The third matrix electrodes are inserted into the structure of crossed electrodes constituted by the first electrodes and the second electrodes. These third electrodes are connected together by linking tracks in order to constitute a matrix structure of groups of third electrodes or macroelectrodes of larger size, which makes it possible to increase their detection range and to limit the number of linking tracks towards the periphery of the detection area.

This matrix structure of macroelectrodes is more particularly used in order to detect objects of interest remote from the detection surface. Of course, its spatial resolution is degraded with respect to that of the structure of crossed electrodes, but this is not a problem since in any case, the minimum spatial resolution that can be physically reached degrades with the distance from the objects of interest due to the spreading out of the electric field lines.

This double structure arrangement has the advantage of making it possible to considerably reduce the number of linking tracks that must cross the detection surface, as well as the number of measurement pathways, while preserving both:
- the spatial resolution for measurements on objects of interest in contact with, or in the immediate vicinity of, the detection surface, and
- the capacity to detect a plurality of objects of interest remote from the detection surface.

Reducing the number of linking tracks has two advantages:
- the surface available for electrodes increases,
- the parasitic couplings between the objects of interest and the linking tracks reduce.

These advantages are particularly important for the production of large sensitive screens or surfaces.

For example, the invention makes it possible, while maintaining comparable measurement performances, to replace a matrix structure of L rows and C columns, i.e. L×C electrodes, therefore with L×C linking tracks which must cross the sensitive surface in order to be connected to detection electronics, with:
- L+C electrodes in rows and columns, which do not require linking tracks when they extend up to at least one edge of the sensitive surface, and
- (L×C)/g macroelectrodes and linking tracks, with g being the total number of electrodes in each group of third electrodes.

For example, if the third electrodes are grouped in groups of four in the first and the second direction (i.e. sixteen electrodes in total), the total number of linking tracks can be reduced by a factor of sixteen.

BRIEF DESCRIPTION OF THE DRAWINGS

Other advantages and characteristics of the invention will become apparent on examination of the detailed description of embodiments which are in no way limitative, and the following attached drawings.

DETAILED DESCRIPTION

It is well understood that the embodiments that will be described below are in no way limitative. It is possible in particular to consider variants of the invention comprising only a selection of characteristics described hereinafter, in isolation from the other characteristics described, if this selection of characteristics is sufficient to confer a technical advantage or to differentiate the invention with respect to the state of the prior art. This selection comprises at least one, preferably functional, characteristic without structural details, or with only a part of the structural details if this part alone is sufficient to confer a technical advantage or to differentiate the invention with respect to the state of the prior art.

In particular, all the variants and all the embodiments described can be combined together if there is no objection to this combination from a technical point of view.

In the figures, the elements common to several figures retain the same reference.

Figure 1:
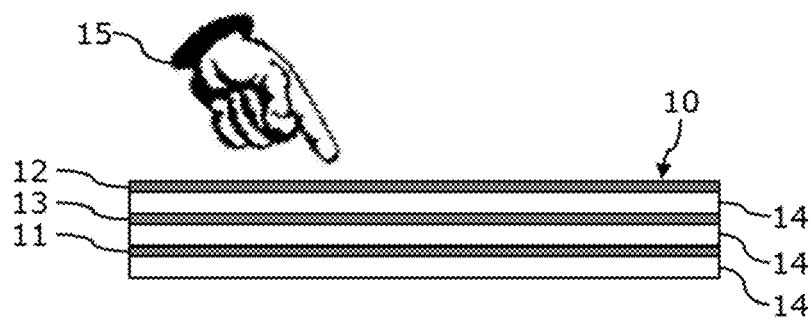
FIG. 1 shows a profile view of the device according to the invention with a three-layer structure.
Figure 2:
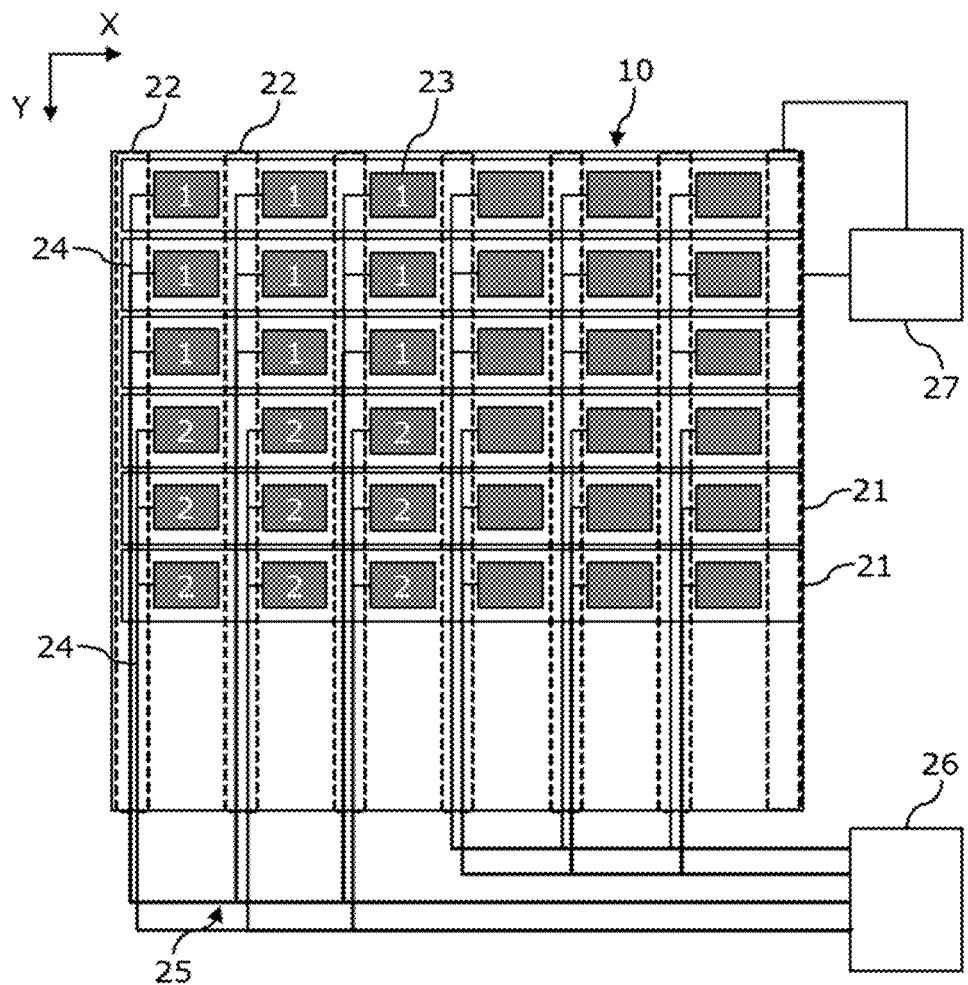
FIG. 2 shows a first embodiment of the device according to the invention.

With reference to FIG. 1 and FIG. 2 a first embodiment of the capacitive interface device according to the invention will be described.

The interface device comprises a detection surface 10 that is produced in the form of a multilayer detection panel with capacitive electrodes. More precisely, this detection surface 10 can be defined as the surface above which an object of interest 15 (such as a finger or another part of the body) can interact with capacitive electrodes and thus be detected.

Thus, an object of interest can be detected while it is in contact with the detection surface 10 (detection of contact) or in a detection area facing this detection surface 10 (detection of proximity or hovering).

The panel constituting the detection surface 10 comprises a plurality of conductive layers 11, 12, 13 in order to produce the electrodes and the linking tracks deposited on layers of dielectric substrate 14.

This panel can be produced in different ways.

In order to produce opaque surfaces, it can be produced with a conventional multilayer printed circuit board (PCB), with conductive layers 11, 12, 13 of metal intercalated with layers of dielectric substrate 14. So that it can be shaped to a particular surface, it can be produced with a flexible printed circuit board, with a dielectric substrate 14 of the polyimide type, for example.

The panel constituting the detection surface 10 can also be produced so as to be substantially transparent, in order to be able to be superimposed for example on a glass pane, a mirror or a display screen, of the TFT or OLED type, for example.

In this case, the dielectric substrate can be for example PET (polyethylene terephthalate) of a thickness of the order of 25 µm to 100 µm, or glass.

The conductive layers constituting the electrodes and the linking tracks are produced with deposits of ITO (indium tin oxide). They can also comprise metal structures based on nanowires, of the "metal mesh" type for example, in order to produce the linking tracks and/or the electrodes.

The detection surface 10, or the detection panel, comprises two mixed electrode structures: a rows and columns electrode structure and a matrix electrode structure.

The rows and columns electrode structure is intended to detect more particularly objects of interest 15 in immediate proximity to the detection surface 10 or in contact with this surface.

It comprises first capacitive electrodes 21 that extend in a first direction X, thus in a row in the embodiment in FIG. 2. These first electrodes 21 are produced in a first layer 11 of conductive material, which is also the layer furthest from the detection area of the objects of interest 15. These first electrodes 21 are produced in the form of strips, the width of which is close to the pitch between two successive electrodes, with minimal space between them. Thus, they cover almost the entire surface of the first layer 11 of conductive material, so as to constitute an effective protection against the electromagnetic disturbances originating from the underlying electronics, such as for example the display screen on which the panel is fixed. In the embodiment shown, the first electrodes 21 extend from one edge to the other of the detection surface 10 in the first direction X.

The rows and columns electrode structure also comprises second capacitive electrodes 22 that extend in a second direction Y, thus in columns in the embodiment in FIG. 2. These second electrodes 22 are produced in a second layer 12 of conductive material, which is also the layer closest to the detection area of the objects of interest 15. The width thereof is substantially less than the width of the first electrodes 21 and they are arranged spaced apart.

The second capacitive electrodes 22 are thus superimposed on the first capacitive electrodes 21. The first electrodes 21 and the second electrodes 22 constitute a mesh the pitch of which in the X and Y directions is adjusted in order to make it possible to distinguish between objects of interest 15 that are close together. This separation capability or "pinch" is determined precisely by the pitch of the electrodes.

The first electrodes 21 and the second electrodes 22 are connected to rows/columns capacitive detection electronics 27.

The matrix electrode structure comprises third electrodes 23 distributed in a matrix having one and the same pitch as the mesh of the first electrodes 21 and the second electrodes 22.

These third electrodes 23 are produced on a third conductive layer 13 arranged between the conductive layer 11 of the first electrodes and the conductive layer 12 of the second electrodes 22. They are positioned, in the first direction X, between the second electrodes 22, with a dimension in this first direction X less than the space between the successive second electrodes 22, so that there is no overlap between these third electrodes 23 and the second electrodes 22. The third electrodes 23 are also positioned in the second direction Y facing the first electrodes 21, with a dimension in this second direction Y less than the width of the first electrodes 21. Thus, the third electrodes 23 are arranged so as to leave sufficient free spaces in order to allow electrical interactions between the first electrodes 21, the second electrodes 22 and the objects of interest 15. Moreover, each third electrode 23 is protected from electromagnetic disturbances and parasitic capacitive couplings by the first electrode 21 above which is it positioned.

The third electrodes 23 are connected at the periphery of the detection surface 10 by linking tracks 24 that are produced in the same third conductive layer 13 as these electrodes.

Each linking track 24 is connected, in the detection surface 10, to several successive third electrodes 23. In the embodiment shown, each linking track 24 is thus connected to three successive third electrodes 23 in the second direction Y. Of course, this is a non-limitative example and in practice, each linking track 24 can be connected to any number of third electrodes 23.

The third electrodes 23 thus connected to a linking track 24 act as a single electrode, or macroelectrode, of a dimension corresponding substantially to the surface covered by the assembly of the interconnected third electrodes 23. Preferably, adjacent third electrodes are connected so as to form macroelectrodes with a connected surface.

The linking tracks 24 extend essentially in the second direction Y. They are arranged under a second electrode 22 which makes it possible to protect them from the interactions with the objects of interest 15, sources of distortions and cross-talk.

Each linking track 24 originating from the detection surface 10 can be directly connected to matrix capacitive detection electronics 26.

In the embodiment shown, the linking tracks 24 originating from adjacent third electrodes 23 in the first direction X (for example 3 adjacent columns) are electrically connected or interconnected in an area on the periphery, or a peripheral area 25 of the detection surface.

Thus, a matrix of macroelectrodes is produced the pitch of which is comparable in the two directions X and Y. Two examples of such macroelectrodes 1, 2 are shown in FIG. 2. Only the linking tracks 24 thus grouped are connected to the matrix capacitive detection electronics 26.

It is also possible in the peripheral area 25 to interconnect only a portion of the linking tracks originating from adjacent columns, in order to produce macroelectrodes 1,2 of different size depending on their position in the detection surface 10. It is possible, for example, to produce a matrix of microelectrodes 1,2 in this way, the pitch of which in the two directions X and Y is comparable, except at the edge of the detection area 10, where the pitch in the direction X corresponds to that of the columns.

The rows/columns capacitive detection electronics 27 and the matrix capacitive detection electronics 26 can of course be produced in the form of one and the same electronics or one and the same electronic circuit.

Figure 3:
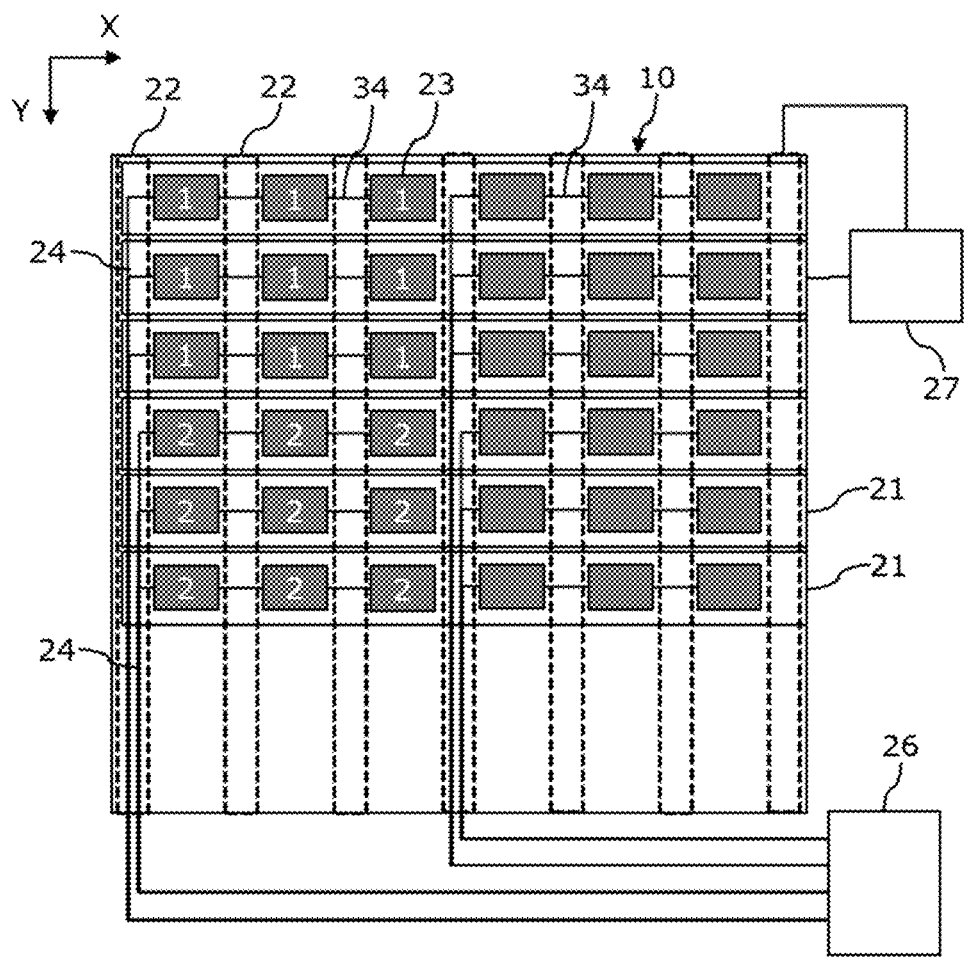
FIG. 3 shows a second embodiment of the device according to the invention.

With reference to FIG. 3, a second embodiment of the device according to the invention will now be described.

Unless otherwise stated, everything that has been described with respect to the embodiments shown in FIG. 1 and FIG. 2 can be applied to this embodiment. Thus, only the differences will be outlined.

As before, the detection surface 10, or the detection panel, comprises two mixed electrode structures: a rows and columns electrode structure and a matrix electrode structure.

The rows and columns electrode structure comprises first capacitive electrodes 21 that extend in a first direction X. These first electrodes 21 are produced in a first layer 11 of conductive material, which is also the layer furthest from the detection area of the objects of interest 15. These first electrodes 21 are produced in the form of strips, the width of which is close to the pitch between two successive electrodes, with minimal space between them.

The rows and columns electrode structure also comprises second capacitive electrodes 22 that extend in a second direction Y. These second electrodes 22 are produced in a second layer 12 of conductive material, which is also the layer closest to the detection area of the objects of interest 15. The width thereof is substantially less than the width of the first electrodes 21 and arranged spaced apart.

The first electrodes 21 and the second electrodes 22 are connected to rows/columns capacitive detection electronics 27.

The matrix electrode structure comprises third electrodes 23 distributed in an arrangement of a matrix having one and the same pitch as the mesh of the first electrodes 21 and the second electrodes 22.

These third electrodes 23 are produced on a third conductive layer 13 arranged between the conductive layer 11 of the first electrodes and the conductive layer 12 of the second electrodes 22. They are positioned, in the first direction X, between the second electrodes 22, with a dimension in this first direction X less than the space between the successive second electrodes 22, such that there is no overlap between these third electrodes 23 and the second electrodes 22. The third electrodes 23 are also positioned in the second direction Y facing the first electrodes 21, with a dimension in this second direction Y less than the width of the first electrodes 21.

The third electrodes 23 are connected at the periphery of the detection surface 10 by linking tracks 24 that are produced in the same third conductive layer 13 as these electrodes.

Each linking track 24 is connected, in the detection surface 10, to several successive third electrodes 23. In the embodiment shown, each linking track 24 is thus connected to three successive third electrodes 23 in the second direction Y. Of course, this is a non-limitative example and in practice, each linking track 24 can be connected to any number of third electrodes 23.

In this embodiment, the sensitive surface 10 also comprises inter-electrode linking tracks 34 which make it possible to connect successive or adjacent third electrodes 23 in the first direction X. These inter-electrode linking tracks 34 are produced in the same third conductive layer 13 as the third electrodes 23 and the linking tracks 24. In the embodiment shown, three successive third electrodes 23 are thus connected in the first direction X. Of course, this is a non-limitative example and in practice any number of third electrodes 23 can be connected in this manner.

Macroelectrodes 1, 2 are thus produced directly at the sensitive surface 10. In the embodiment shown and by way of example, these macroelectrodes comprise nine third electrodes 23.

This embodiment has the advantage of requiring fewer linking tracks 24, since a single linking track 24 is necessary for each microelectrode.

The linking tracks 24 originating from the macroelectrodes 1, 2 extend essentially in the second direction Y. They are arranged under a second electrode 22 which makes it possible to protect them from interactions with the objects of interest 15, sources of distortions and cross-talk.

The linking tracks 24 originating from the detection surface 10 are then connected to matrix capacitive detection electronics 26.

Figure 4:
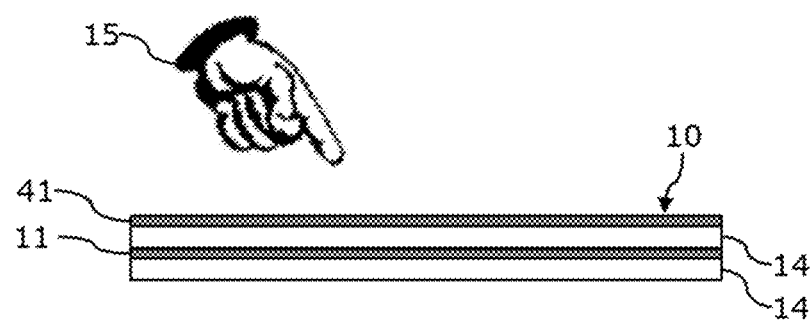
FIG. 4 shows a profile view of the device according to the invention with a two-layer structure.
Figure 5:
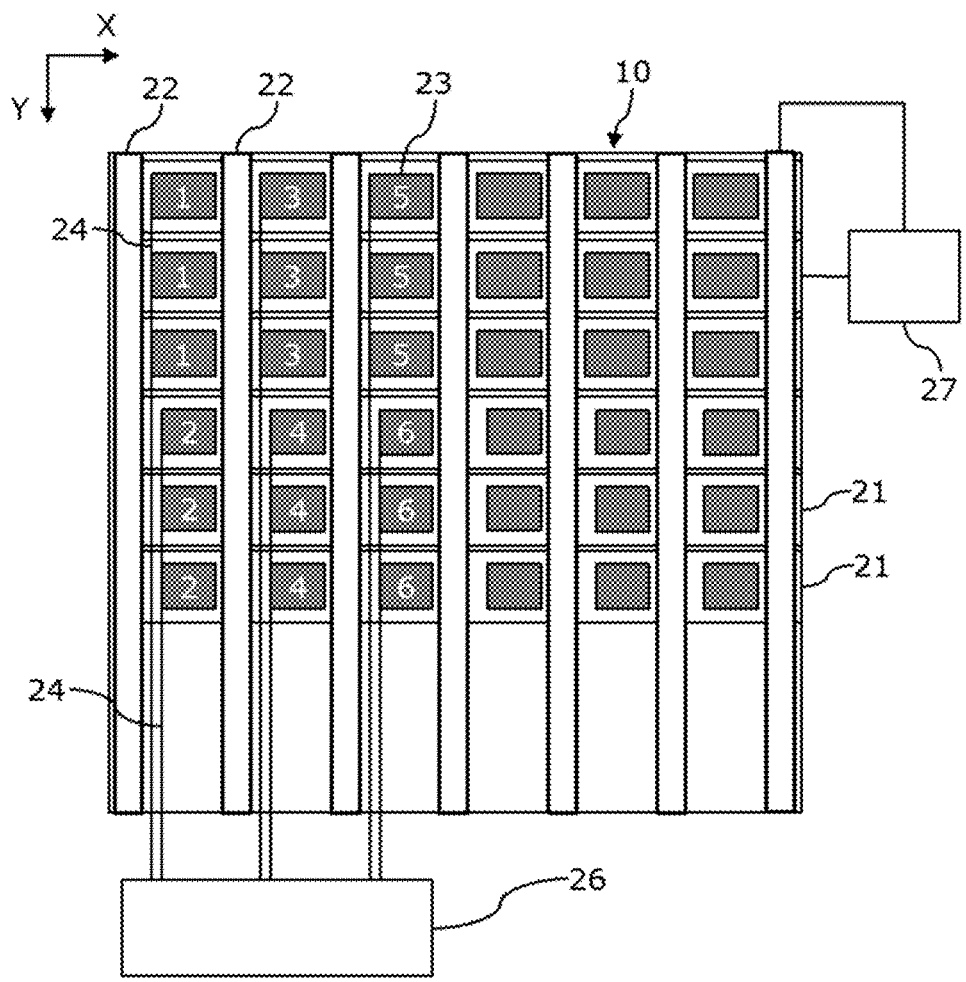
FIG. 5 shows a third embodiment of the device according to the invention.

With reference to FIG. 4 and FIG. 5, a third embodiment of the device according to the invention will now be described.

Unless otherwise stated, everything that has been described in particular with respect to FIG. 1 and FIG. 2 can be applied to this embodiment. Thus, only the differences will be outlined.

This embodiment differs essentially from that described in relation to FIGS. 1 and 2 in that the linking tracks and the electrodes are produced in two conductive layers 11, 41 arranged on dielectric substrate layers 14.

As before, the detection surface 10, or the detection panel, comprises two mixed electrode structures: a rows and columns electrode structure and a matrix electrode structure.

The rows and columns electrode structure comprises first capacitive electrodes 21 that extend in a first direction X. These first electrodes 21 are produced in a first layer 11 of conductive material, which is also the layer furthest from the detection area of the objects of interest 15. These first electrodes 21 are produced in the form of strips, the width of which is close to the pitch between two successive electrodes, with minimal space between them.

The rows and columns electrode structure also comprises second capacitive electrodes 22 that extend in a second direction Y. These second electrodes 22 are produced in a second layer 41 of conductive material, which is also the layer closest to the detection area of the objects of interest 15. The width thereof is substantially less than the width of the first electrodes 21 and arranged spaced apart.

The first electrodes 21 and the second electrodes 22 are connected to rows/columns capacitive detection electronics 27.

The matrix electrode structure comprises third electrodes 23 distributed in an arrangement of a matrix having one and the same pitch as the mesh of the first electrodes 21 and the second electrodes 22.

These third electrodes 23 are produced on the second later 41 that comprises the second electrodes 22. They are positioned, in the first direction X, between the second electrodes 22, with a dimension in this first direction X less than the space between the successive second electrodes 22. The third electrodes 23 are also positioned in the second direction Y facing the first electrodes 21, with a dimension in this second direction Y less than the width of the first electrodes 21.

The third electrodes 23 are at the periphery of the detection surface 10 by linking tracks 24 that are traced on the same second conductive layer 41 as these electrodes.

Each linking track 24 is connected, within the detection surface 10, to several successive third electrodes 23. In the embodiment shown, each linking track 24 is thus connected to three successive third electrodes 23 in the second direction Y. Of course, this is a non-limitative example and in practice, each linking track 24 can be connected to any number of third electrodes 23.

The third electrodes 23 thus connected to a linking track 24 act as a single electrode, or macroelectrode, of a dimension corresponding substantially to the surface area covered by the assembly of the interconnected third electrodes 23.

The linking tracks 24 extend essentially in the second direction Y. They are arranged parallel to the second electrodes 22, between these second electrodes 22 and the third electrodes 23. In the embodiment shown, the dimension of the third electrodes 23 in the second direction Y is also reduced depending on the number of linking tracks 24 originating from other third electrodes 23 running alongside them.

This embodiment has the advantage of being able to be produced with a panel of two conductive layers. However, the linking tracks 24 are exposed to the capacitive couplings with the objects of interest, which can be sources of crosstalk. However, this effect is less of a problem than for a conventional matrix electrode structure alone because:
  there are fewer linking tracks 24, and above all,
  in order for there to be a significant disturbance effect, the coupling between the object of interest and the linking tracks 24 must be significant, which means that the object of interest 15 is in immediate proximity to or in contact with the detection surface 10. And in this case, the object of interest is also detected without disturbances by the first electrodes 21 and the second electrodes 22.

In the embodiment shown, each linking track 24 originating from the detection surface 10 is directly connected to matrix capacitive detection electronics 26.

As for the embodiment in FIG. 2, the linking tracks 24 originating from adjacent third electrodes 23 in the first direction X (for example 3 adjacent columns) can be electrically connected or interconnected in an area at the periphery, or a peripheral area 25 of the detection surface, so as to produce a matrix of macroelectrodes the pitch of which in the two directions X and Y is comparable. It is also possible in the peripheral area 25 to only interconnect a portion of the linking tracks originating from adjacent columns, so as to produce macroelectrodes 1,2 of different size depending on their position in the detection surface 10.

According to variants applicable in particular to all of the embodiments previously described:
  The touch and contactless interface device according to the invention can comprise first electrodes 21 and/or second electrodes 22, the extension of which from an edge of the detection surface 10 within this detection surface 10 is limited and therefore does not reach the opposite edge. The touch and contactless interface device according to the invention can thus comprise first electrodes 21 and/or second electrodes 22 that extend from an edge of the detection surface 10 up to the middle of this detection surface. In this case, each row and/or each column of the detection surface 10 comprises two separate first electrodes 21 and/or two second electrodes 22;
  the touch or contactless interface device according to the invention can comprise third electrodes 23 with a dimension in the second direction Y corresponding to the overlap or to the extent of several successive first electrodes 21;
  the touch and contactless interface device according to the invention can comprise a single first electrode 21 extending over the entire sensitive surface 10. This first electrode 21 can be connected to the rows/columns capacitive detection electronics 27 in the same way as several first electrodes 21. Of course, in this case, detecting objects of interest 15 in the second direction (Y) is carried out only with third electrodes.

Embodiments of electronic capacitive detection means intended to be connected to the first, second and third capacitive electrodes in order to make it possible to detect and locate objects of interest 15 will now be described.

In the embodiments previously described, these electronic capacitive detection means comprise:
  rows/columns capacitive detection electronics 27 intended to be connected to the first electrodes 21 (or, if necessary, to a first electrode 21) and to the second electrodes 22;
  matrix capacitive detection electronics 26 intended to be connected to the third electrodes 23 via linking tracks 24.

Of course, the rows/columns capacitive detection electronics 27 and the matrix capacitive detection electronics 26 can be produced, in the context of the invention, in the form of two separate electronic modules, or in the form of a single electronic module. Similarly, they can comprise separate measurement pathways, and/or common or mutualized measurement pathways.

These electronic capacitive detection means can comprise analogue electronic components and modules and/or digital components and modules, with microprocessors, etc.

The electronic capacitive detection means are connected at the output to calculation means, for example of the computer, microprocessor, FPGA, etc. type, in order to process the measurements, determine the positions and/or the movements of objects of interest 15, and exploit this information in order to carry out for example environment detection or human-machine interface functions.

In the embodiment shown:
  The rows/columns capacitive detection electronics 27 is arranged in order to carry out measurements of coupling capacitances, in "mutual" mode, between the first electrodes 21 used as excitation electrodes (or, if necessary, the first electrode 21 used as excitation electrode) and the second electrodes 22 used as measurement electrodes. The presence of an object of interest 15 near to an intersection or an area of overlap between a first electrode 21 and a second electrode 22 disturbs the coupling capacitance between these two electrodes, which makes it possible to detect its presence;
  The matrix capacitive detection electronics 26 is arranged in order to carry out direct capacitance measurements in "self-capacitance" mode. In this case, the coupling capacitance between an electrode and the objects of interest in the vicinity thereof is measured directly.

Figure 6:
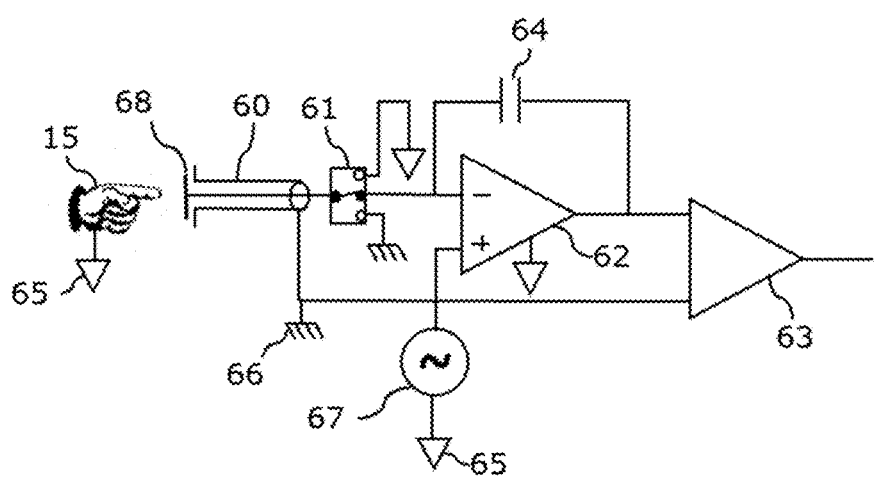
FIG. 6 shows a circuit diagram of capacitive electronics for carrying out direct capacitance measurements in "self-capacitance" mode, which utilizes an active guard.

With reference to FIG. 6, an embodiment of capacitive electronics for carrying out direct capacitance measurements in "self-capacitance" mode will now be described.

This embodiment utilizes an active guard.

The electronic diagram utilized in this embodiment is based on a charge amplifier 62 shown in the form of an operational amplifier 62 with a feedback capacitor 64.

It makes it possible to measure the capacitance between an object of interest 15 globally referenced or connected to the system common ground 65 (i.e. the ground or the reference potential of the electronics or device, which can also be an earth) and a capacitive measurement electrode 68.

These capacitive electronics can in particular be utilized in the matrix capacitive detection electronics 26. In this case, the capacitive measurement electrode 68 corresponds to a group of third electrodes 23 connected to a linking track or a microelectrode 1, 2. Measuring this capacitance makes it possible to deduce for example an item of information of distance between the object of interest 15 and the measurement electrode 68.

The measurement electrode 68 is connected to the (−) input of the charge amplifier 62.

The (+) input of the charge amplifier 62 is excited by an oscillator 67 which delivers an alternating reference voltage 66, also called guard potential 66. The measurement electrode 68 is thus substantially polarized at this same reference voltage 66.

The output of the charge amplifier is connected to a differential amplifier 63 which makes it possible to obtain at the output a voltage representative of the capacitances at the input of the charge amplifier 62, and thus produce exploitable items of location and/or distance information for objects of interest 15.

The device also comprises guard elements 60 intended to protect the measurement electrodes 68 and the linking elements between the electrodes 68 and the electronics. These guard elements 60 are polarized at the guard potential 66 generated by the oscillator 67, which is thus used as excitation potential in order to generate an active guard at approximately the same potential as the measurement electrodes 68.

In the embodiments shown, these guard elements 60 comprise in particular the first electrodes 21 and the second electrodes 22, that are connected to the guard potential 66 at least while measurements are carried out with the third electrodes 23. The guard elements 60 also comprise the third electrodes 23 that are not measuring electrodes.

The device also comprises polling means or switches 61 which make it possible to select or configure the electrodes 68. These switches 61 are arranged in such a way that an electrode 68 is:
either connected to the charge amplifier and is for carrying out measurements, in which case it is a measuring electrode,
or connected to the guard potential in order to contribute to the guard elements 60,
or connected to the common ground potential 65 (or according to an alternative, electrically floating solution, in open circuit) in order not to disturb the rows and columns measurements with the first electrodes 21 and the second electrodes 22.

In this embodiment, the capacitive detection electronics with the charge amplifier 62 and the differential amplifier 63 are globally referenced to the common ground 65.

However, this embodiment has the drawback of allowing the presence of leakage capacitances between the electrodes 68 and/or the input of the charge amplifier 62 and elements at the common ground potential 65.

Figure 7:
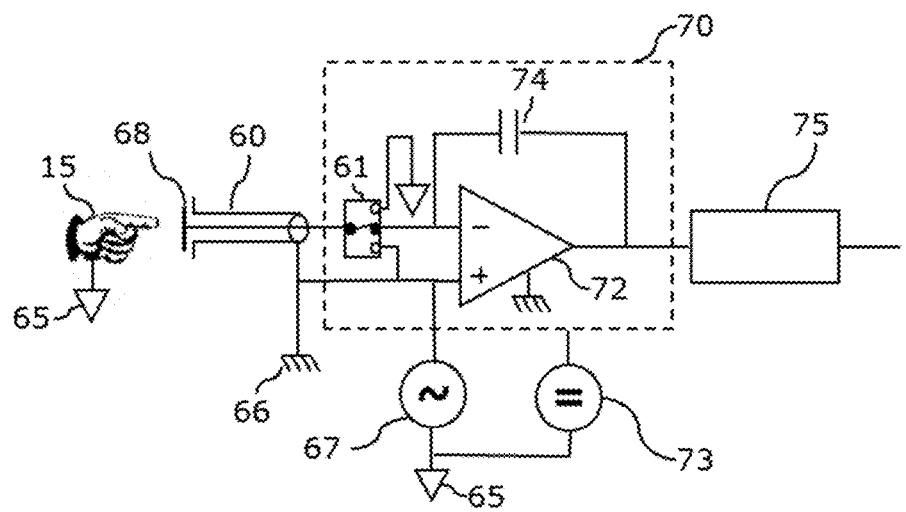
FIG. 7 shows a circuit diagram of capacitive electronics for carrying out direct capacitance measurements in "self-capacitance" mode, which utilizes an active guard and electronics referenced to the guard potential.

With reference to FIG. 7, a second embodiment of capacitive electronics for carrying out direct measurements of capacitance in "self-capacitance" mode will now be described.

This embodiment utilizes an active guard and electronics referenced to the guard potential.

As above, it also makes it possible to measure the capacitance between an object of interest 15 referenced to the common ground of the system 65 and a capacitive measurement electrode 68.

These capacitive electronics can in particular be utilized in the matrix capacitive detection electronics 26. In this case, the capacitive measurement electrode 68 corresponds to a group of third electrodes 23 connected to a linking track or a macroelectrode 1, 2. As described above, measuring this capacitance makes it possible to deduce for example the distance between the object of interest 15 and the measurement electrode 68.

In this embodiment, the electronics comprises a portion called "floating" portion 70 generally referenced to an alternating reference potential 66 (or guard potential) generated by an oscillator 67. Thus, leakage capacitances cannot occur, since all of the elements, including the electrodes 68 and the sensitive portion of the detection electronics, are at the same guard potential. It is thus possible to obtain high sensitivities and to detect objects of interest 15 at distances of several centimeters.

This type of detection electronics, called "floating reference" or "floating bridge", is described in detail for example in the document U.S. Pat. No. 8,933,710. Thus, for reasons of brevity, only the essential characteristics are mentioned here.

As above, the electronic diagram utilized in this embodiment is based on a charge amplifier 72, shown in the form of an operational amplifier 72 with a feedback capacitor 74.

The charge amplifier 72, like the entire sensitive portion of the detection electronics, is referenced to the guard potential 66 and thus forms part of the floating portion 70 of the electronics.

This floating portion 70 can of course comprise other means of processing and conditioning the signal, including digital or microprocessor-based, also referenced to the guard potential 66. These means of processing and conditioning make it possible for example to calculate distance and position information based on capacitive measurements.

The electrical supply for the floating portion 70 is provided by floating supply conversion means 73, comprising for example DC/DC converters.

The floating electronics 70 is connected at the output to the electronics of the apparatus referenced to the common ground 65 by linking elements 75 compatible with the difference in reference potentials. These linking elements 75 can comprise for example differential amplifiers or optocouplers. Thus, at the output of these linking elements 75 items of exploitable location and/or distance information of objects of interest are obtained.

In the embodiment shown, the measurement electrode 68 is connected to the (−) input of the charge amplifier 72.

The (+) input of the charge amplifier 72 is excited by the oscillator 67 which delivers the alternating reference voltage 66, or guard potential 66. The measurement electrode 68 is thus substantially polarized at this same reference voltage 66.

The device also comprises guard elements 60 intended to protect the measurement electrodes 68 and the linking elements between the electrodes 68 and the electronics. These guard elements 60 are polarized at the guard potential 66 generated by the oscillator 67, which is thus also the reference potential of the floating electronics 70.

In the embodiments shown, these guard elements 60 comprise in particular the first electrodes 21 and the second electrodes 22, that are connected to the guard potential 66 at least while measurements are carried out with the third electrodes 23. The guard elements 60 also comprise the third electrodes 23 that are not measuring electrodes.

The device also comprises scanning means or switches 61 which make it possible to select or configure the electrodes 68. These switches 61 are arranged such that an electrode 68 is:
- either connected to the charge amplifier and is for carrying out measurements, in which case it is a measuring electrode,
- or connected to the guard potential in order to contribute to the guard elements 60,
- or connected to the common ground potential 65 (or according to an alternative, electrically floating solution, an open circuit) in order not to disturb the rows and columns measurements with the first electrodes 21 and the second electrodes 22.

In the embodiments shown, the matrix capacitive detection electronics 26 can comprise one or more charge amplifiers connected respectively to a plurality of groups of electrodes 23 (or macroelectrodes 1, 2) by switches 61. In this case, the measurements are at least partly carried out sequentially.

The matrix capacitive detection electronics 26 can also comprise as many charge amplifiers as groups of electrodes 23 (or macroelectrodes 1, 2). This makes it possible to carry out all of the measurements in parallel. In this case, the switches 61 can be arranged so that an electrode 68 is:
- either connected to the charge amplifier and is for carrying out measurements, in which case it is a measuring electrode,
- or connected to the common ground potential 65 (or according to an alternative, electrically floating solution, an open circuit) in order not to disturb the rows and columns measurements with the first electrodes 21 and the second electrodes 22.

Figure 8:
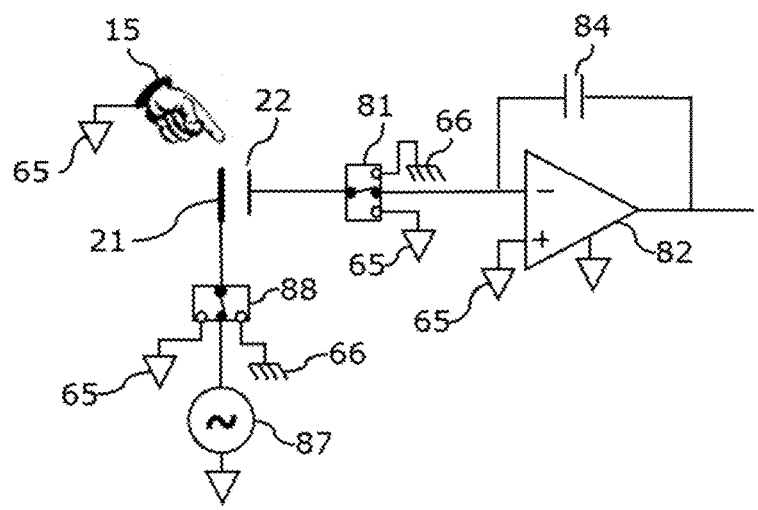
FIG. 8 shows a capacitive electronic diagram for carrying out measurements of coupling capacitances in "mutual" mode.

With reference to FIG. 8, an embodiment of capacitive electronics will now be described for carrying out measurements of coupling capacitance in "mutual" mode, such that it can be utilized in the rows/columns capacitive detection electronics 27.

In this embodiment, the first electrodes 21 are excitation electrodes. They can be polarized at an excitation potential by an excitation source 87 in order to activate the measurements on the corresponding row, or connected to the common ground 65 in order to be deactivated. They are controlled by excitation switches 88 that are arranged such that a first electrodes 21 is:
- either connected to the excitation source 87, in which case it is active for a measurement of coupling capacitance;
- or connected to the common ground 65 of the system, in which case it is inactive;
- or connected to the guard potential 66 in order to contribute to the guard elements 60 when measuring with the third electrodes 23.

According to an embodiment, the excitation source 87 corresponds to the oscillator 67 which generates the guard potential 66. In this case, the excitation potential corresponds to the guard potential 66, and the excitation switches 88 can be arranged such that a first electrode 21 is:
- either connected to the guard potential 66;
- or connected to the common ground 65 of the system, in which case it is inactive.

The second electrodes 22, which are measuring electrodes, are connected respectively by means of measurement switches 81, to a charge amplifier 82 with a feedback capacitor 84.

The measurement switches 81 are arranged such that a second electrode 22 is:
- either connected to the charge amplifier 82, in which case it is active for a measurement of coupling capacitance,
- or connected to the common ground 65 of the system, in which case it is inactive,
- or connected to the guard potential 66 in order to contribute to the guard elements 60 when directly measuring capacitance with the third electrodes 23.

In this embodiment, the electronics is connected to the common ground potential 65.

The excitation 88 and measurement 81 switches make it possible to select a pair of first 21 and second electrodes 22 and thus to specifically measure the coupling capacitance at the intersection of these first and second electrodes. When an object of interest 15 is in immediate proximity to this intersection, it modifies the value of the coupling capacitance, allowing it to be detected.

The rows/columns capacitive detection electronics 27 can comprise a plurality of charge amplifiers 82 in order to carry out measurements in parallel. It can also comprise as many charge amplifiers 82 as second electrodes 22. This makes it possible to carry out all of the measurements in parallel. In this case, the measurement switches can be arranged such that a second electrode 22 is:
- either connected to the charge amplifier for carrying out measurements of coupling capacitance, in which case it is a measuring electrode,
- or connected to the guard potential 65 in order to contribute to the guard elements 60 when directly measuring capacitance with the third electrodes 23.

According to a variant embodiment, the rows/columns capacitive detection electronics 27 can be arranged in order to carry out measurements of coupling capacitance, in "mutual" mode, between the second electrodes 22 used as excitation electrodes and the first electrodes 21 used as measurement electrodes.

According to a variant embodiment, the rows/columns capacitive detection electronics 27 can be arranged in order to carry out direct measurements of capacitance in "self-capacitance" mode with the first capacitive electrodes 21 and the second capacitive electrodes 22. In this case, it can be implemented by utilizing:
- the capacitive electronic diagram of direct measurement of capacitance in "self-capacitance" mode with an active guard described with respect to FIG. 6; or
- the capacitive electronic diagram of direct measurement of capacitance in "self-capacitance" mode with an active guard and electronics referenced to the guard potential described with respect to FIG. 7.

This embodiment can be produced with all of the panel and electrode structures described above with respect to FIG. 1 and FIG. 5 in particular.

In this embodiment of the rows/columns capacitive detection electronics 27:
- The first electrodes 21 and the second electrodes 22 thus correspond to the capacitive measurement electrodes 68 in FIG. 6 and FIG. 7. They are connected to charge amplifiers 62, 72 directly or by means of switches 61;
- The switches 61 are arranged so as to connect the measurement electrodes 68 to the guard potential 66 or to the input of the charge amplifier 62, 72, or optionally to the ground 65.
- The device can be arranged in order to comprise:
- Charge amplifiers 62, 72 each connected, directly or via switches either to first electrodes 21, or to second electrodes 22, or to third electrodes 23;

Charge amplifiers 62, 72 connected via switches, to at least two sorts of capacitive electrodes from among the first electrodes 21, the second electrodes 22 and the third electrodes 23.

The rows/columns capacitive detection electronics 27 and the matrix capacitive detection electronics 26 can be merged or separate.

This variant embodiment with first capacitive electrodes 21 and second capacitive electrodes 22 used in "self-capacitance" mode makes it possible to increase the detection range of these first capacitive electrodes 21 and these second capacitive electrodes 22. However, it has the drawback of also allowing the appearance of ghost measurements in the presence of several objects of interest 15. It is noted that the measurements of the third electrodes 23 can be used in order to reject certain ghost measurements.

A method for measuring and detecting objects of interest 15 according to the invention will now be described.

This method can be utilized with any one of the embodiments described above.

The measurement method comprises a step of measuring approach or hovering using the third electrodes 23. To this end, the first electrodes 21 and the second electrodes 22 are polarized at the guard potential 66 by, respectively, the excitation switches 88 and the measurement switches 81. Thus, they contribute to the guard elements 60. The third electrodes 23 are polled sequentially or in parallel as described in the embodiments of the electronics with respect to FIG. 6 or FIG. 7. Thus, it is possible to detect and measure the position and the distance of objects of interest 15 in the vicinity of the third electrodes 23, including at distances of several centimeters or even several tens of centimeters.

The measurement method also comprises a step of measuring contact or "touches" using the first electrodes 21 and the second electrodes 22. To this end, when the measurements are carried out in "mutual" mode (measurement of coupling capacitances), the third electrodes 23 are connected to the ground potential 65 (or configured in floating mode, electrically disconnected), by the switches 61. The measurements of coupling capacitances are carried out with pairs of first electrodes 21 and the second electrodes as described in the embodiment of the electronics with respect to FIG. 8. It is thus possible to detect and measure the position and the distance of objects of interest 15 in immediate proximity to or in contact with the detection surface 10, with a high level of accuracy in the location thereof. When the measurements are carried out in "self-capacitance" mode (direct measurement of capacitances), the first electrode or electrodes 21 and the second electrodes 22 are connected sequentially or in parallel to charge amplifiers 62, 72, directly or via switches 61 as described with respect to FIG. 6 or FIG. 7.

According to the embodiments, it is possible, for example:
- to execute systematically the steps of approach measurements and contact measurement sequentially;
- to execute the step of approach measurements and, when objects of interest are detected in a vicinity, to execute the step of contact measurement,
- when measurements of contact with the first electrodes 21 and the second electrodes 22 are executed in "self-capacitance" mode, to execute the steps of approach measurements and contact measurement simultaneously, as all the electrodes are at the guard potential 66.

Of course, the measurements obtained during the steps of approach measurements and the steps of contact measurement can be combined or analyzed together in an analysis step in order to improve the detection and measurement of the position of the objects of interest 15, and/or reject artefacts or inaccurate measurements.

Of course, the invention is not limited to the examples which have just been described and numerous adjustments can be made to these examples without exceeding the scope of the invention.

The invention claimed is:

1. A capacitive interface device comprising:
a detection surface with:
one or more first capacitive electrodes extending at least in a first direction (X);
second capacitive electrodes arranged facing the one or more first capacitive electrodes and extending in a second direction (Y) different from the first direction (X);
third capacitive electrodes arranged in a matrix between the second capacitive electrodes and facing the one or more first capacitive electrodes;
linking tracks arranged in the detection surface so as to electrically connect a plurality of adjacent third capacitive electrodes;
a first electrically conductive layer with the one or more first capacitive electrodes;
a second electrically conductive layer with the second capacitive electrodes; and
a third electrically conductive layer, arranged between the first electrically conductive layer and the second electrically conductive layer, with the third capacitive electrodes and the linking tracks,
said linking tracks are arranged parallel to the second capacitive electrodes, and at least partly under the second capacitive electrodes to reduce cross-talk caused by parasitic capacitive couplings between the linking tracks and a detected object.

2. The device according to claim 1, further comprising linking tracks with a portion connecting at least a third capacitive electrode at an edge of the detection surface extending essentially in the second direction (Y).

3. The device according to claim 1, further comprising first capacitive electrodes with a dimension in the second direction (Y) that is greater than the separation space between said first capacitive electrodes.

4. The device according to claim 1, further comprising third capacitive electrodes with a dimension in the second direction (Y) less than or equal to the dimension of the one or more first capacitive electrodes in said second direction (Y), and arranged respectively facing a first capacitive electrode.

5. The device according to claim 1, wherein the linking tracks connected respectively to adjacent third capacitive electrodes are also electrically connected (or interconnected) at the periphery or outside the detection surface.

6. The device according to claim 1, further comprising electronic capacitive detection means with at least one charge amplifier making it possible to carry out direct measurements of capacitance between objects of interest in the vicinity of or in contact with the detection surface and groups of third capacitive electrodes.

7. The device according to claim 6, wherein the electronic capacitive detection means comprise polling means making it possible to sequentially connect groups of third capacitive electrodes to a charge amplifier.

8. The device according to claim 6, wherein the electronic capacitive detection means are arranged so as to polarize the one or more first capacitive electrodes and the second capacitive electrodes at potentials identical or proportional to a guard potential, at least during phases of direct measurements of capacitance with the third capacitive electrodes.

9. The device according to claim 8, in which the guard potential comprises one of the following potentials:
   an alternating potential;
   a direct current potential; and
   a potential identical or proportional to a ground potential.

10. The device according to claim 6, further comprising electronic capacitive detection means with at least one charge amplifier making it possible to carry out direct measurements of capacitance between objects of interest in the vicinity of or in contact with the detection surface and, respectively, the one or more first capacitive electrodes and second capacitive electrodes.

11. The device according to claim 6, further comprising electronic capacitive detection means making it possible to carry out measurements of variations of coupling capacitance between the one or more first capacitive electrodes and second capacitive electrodes, to detect the presence of objects of interest in the vicinity of or in contact with the detection surface.

12. The device according to claim 11, further comprising electronic capacitive detection means arranged so as to polarize at least one of the one or more first capacitive electrodes and the second capacitive electrodes with an excitation potential, and to carry out a measurement of coupling capacitance on at least the one or more first capacitive electrodes and the second capacitive electrodes.

13. The device according to claim 11, wherein the electronic detection means are arranged so as to maintain the third capacitive electrodes, at least during phases of measurement of coupling capacitance, in one of the following states:
   polarized at a direct current potential;
   polarized at a potential identical to a ground potential;
   polarized at a potential identical to the potential of at least one first capacitive electrode;
   polarized at a potential identical to the potential of at least one second capacitive electrode; and
   electrically floating.

14. An apparatus comprising a device comprising the capacitive interface device according to claim 1.

15. The apparatus according to claim 14, further comprising the capacitive interface device superimposed on or integrated with a display device.

* * * * *